(12) United States Patent
Wu

(10) Patent No.: US 10,879,080 B1
(45) Date of Patent: Dec. 29, 2020

(54) METHODS FOR FORMING POLYCRYSTALLINE CHANNEL ON DIELECTRIC FILMS WITH CONTROLLED GRAIN BOUNDARIES

(71) Applicant: Taiwan Semiconductor Manufacturing Co., Ltd., Hsinchu (TW)

(72) Inventor: Cheng-Hsien Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/539,953

(22) Filed: Aug. 13, 2019

(51) Int. Cl.
| H01L 21/20 | (2006.01) |
| H01L 21/3205 | (2006.01) |
| H01L 29/786 | (2006.01) |
| H01L 21/04 | (2006.01) |
| H01L 21/02 | (2006.01) |
| H01L 21/324 | (2006.01) |

(52) U.S. Cl.
CPC .. *H01L 21/32055* (2013.01); *H01L 21/02595* (2013.01); *H01L 21/0475* (2013.01); *H01L 29/78672* (2013.01); *H01L 21/02683* (2013.01); *H01L 21/02686* (2013.01); *H01L 21/324* (2013.01)

(58) Field of Classification Search
CPC ......... H01L 21/02532; H01L 21/02595; H01L 21/02683; H01L 21/02691; H01L 21/0475; H01L 21/2026; H01L 21/32055; H01L 27/1281; H01L 29/78672
USPC ......................................... 438/479, 487, 488
See application file for complete search history.

(56) References Cited

U.S. PATENT DOCUMENTS

2006/0154452 A1\* 7/2006 Han .................. H01L 21/02532
438/479
2007/0141816 A1\* 6/2007 Miyairi ............. H01L 21/02691
438/487

OTHER PUBLICATIONS

Im, et al, "On the super lateral growth phenomenon observed in excimer laser-induced crystallization of thin Si films,"*Appl. Phys. Lett.* (64)17, Apr. 25, 1994, pp. 2303-2305.

\* cited by examiner

*Primary Examiner* — Brook Kebede
(74) *Attorney, Agent, or Firm* — Seed IP Law Group LLP

(57) ABSTRACT

A method for forming a polycrystalline semiconductor layer includes forming a plurality of spacers over a dielectric layer, etching the dielectric layer using the plurality of spacers as an etch mask to form a recess in the dielectric layer, depositing an amorphous semiconductor layer over the plurality of spacers and the dielectric layer to fill the recess, and recrystallizing the amorphous semiconductor layer to form a polycrystalline semiconductor layer.

20 Claims, 13 Drawing Sheets

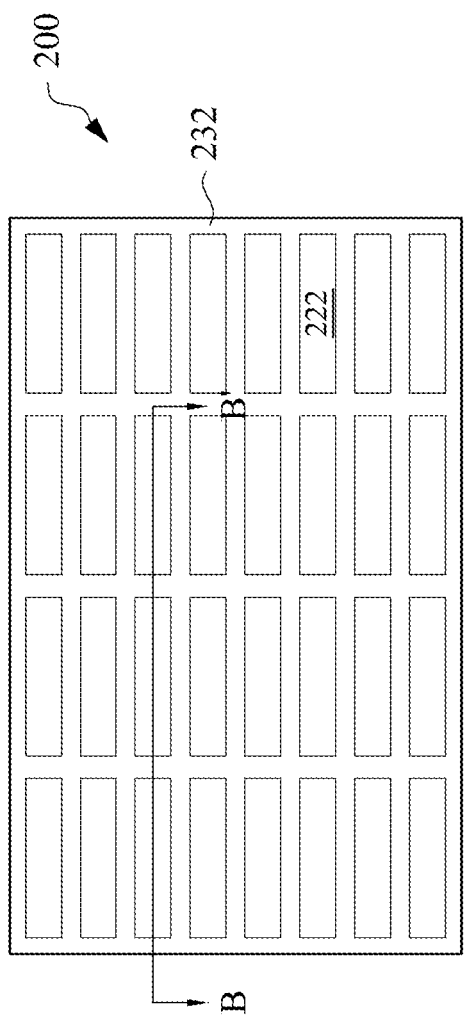
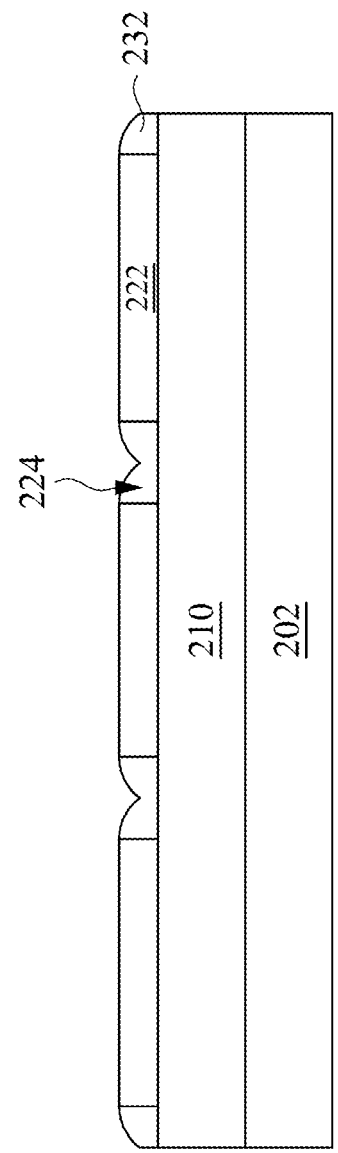
FIG. 5A
FIG. 5B

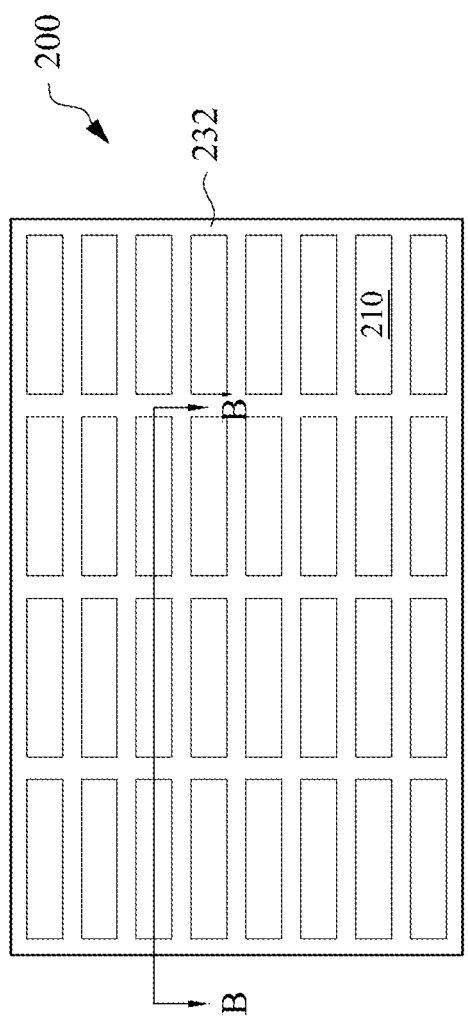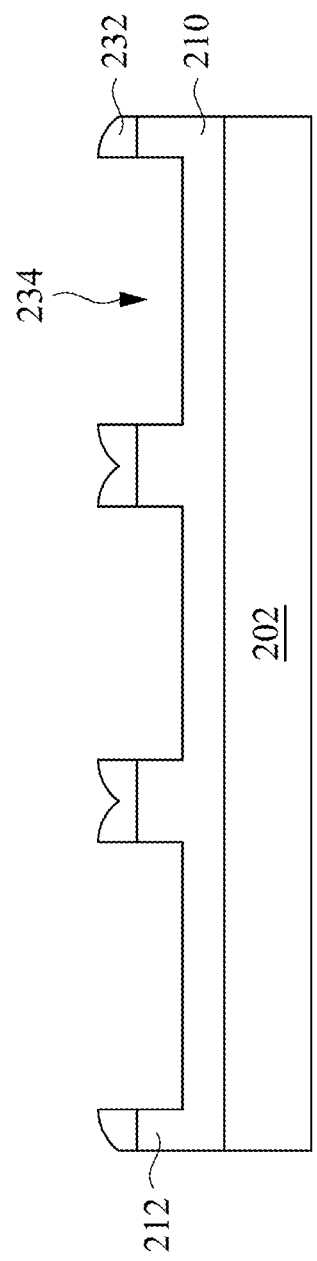
FIG. 7A
FIG. 7B

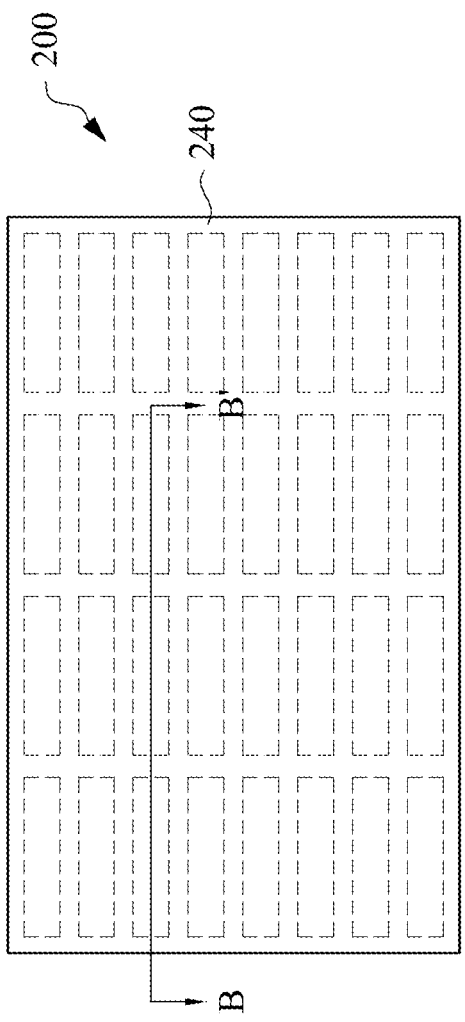
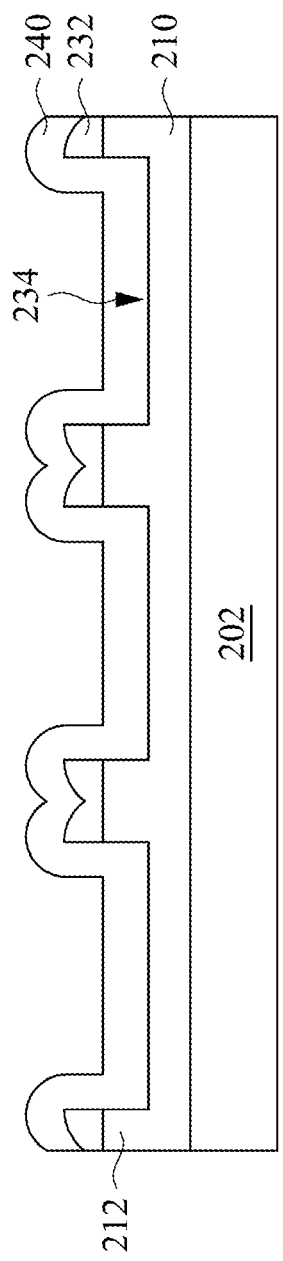
FIG. 8A
FIG. 8B

METHODS FOR FORMING POLYCRYSTALLINE CHANNEL ON DIELECTRIC FILMS WITH CONTROLLED GRAIN BOUNDARIES

BACKGROUND

Polycrystalline silicon is commonly used as a channel material in thin film transistors for active matrix liquid crystal displays due to its high mobility. A polycrystalline silicon film is commonly produced by recrystallization of an amorphous silicon structure. The process of crystallization of amorphous silicon determines quality of the polycrystalline silicon film as well as the final device performance. Polysilicon films with larger crystal grain size and more regular grain boundaries benefit carrier mobility because grain boundaries act as traps and recombination centers for carriers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a top view of the semiconductor device of FIGS. 4A and 4B after forming spacers on sidewalls of the mandrel structures, in accordance with some embodiments.

FIG. 5B is a cross-sectional view of the semiconductor device of FIG. 5A along line B-B'.

FIG. 7A is a top view of the semiconductor device of FIGS. 6A and 6B after forming recesses in the dielectric layer, in accordance with some embodiments.

FIG. 7B is a cross-sectional view of the semiconductor device FIG. 7A along line B-B'.

FIG. 8A is a top view of the semiconductor device of FIGS. 7A and 7B after forming an amorphous semiconductor layer over the spacers and the dielectric layer to fill the recesses, in accordance with some embodiments.

FIGS. 8B and 8C are cross-sectional views of the semiconductor device of FIG. 8A along line B-B'.

DETAILED DESCRIPTION

Figure 1:
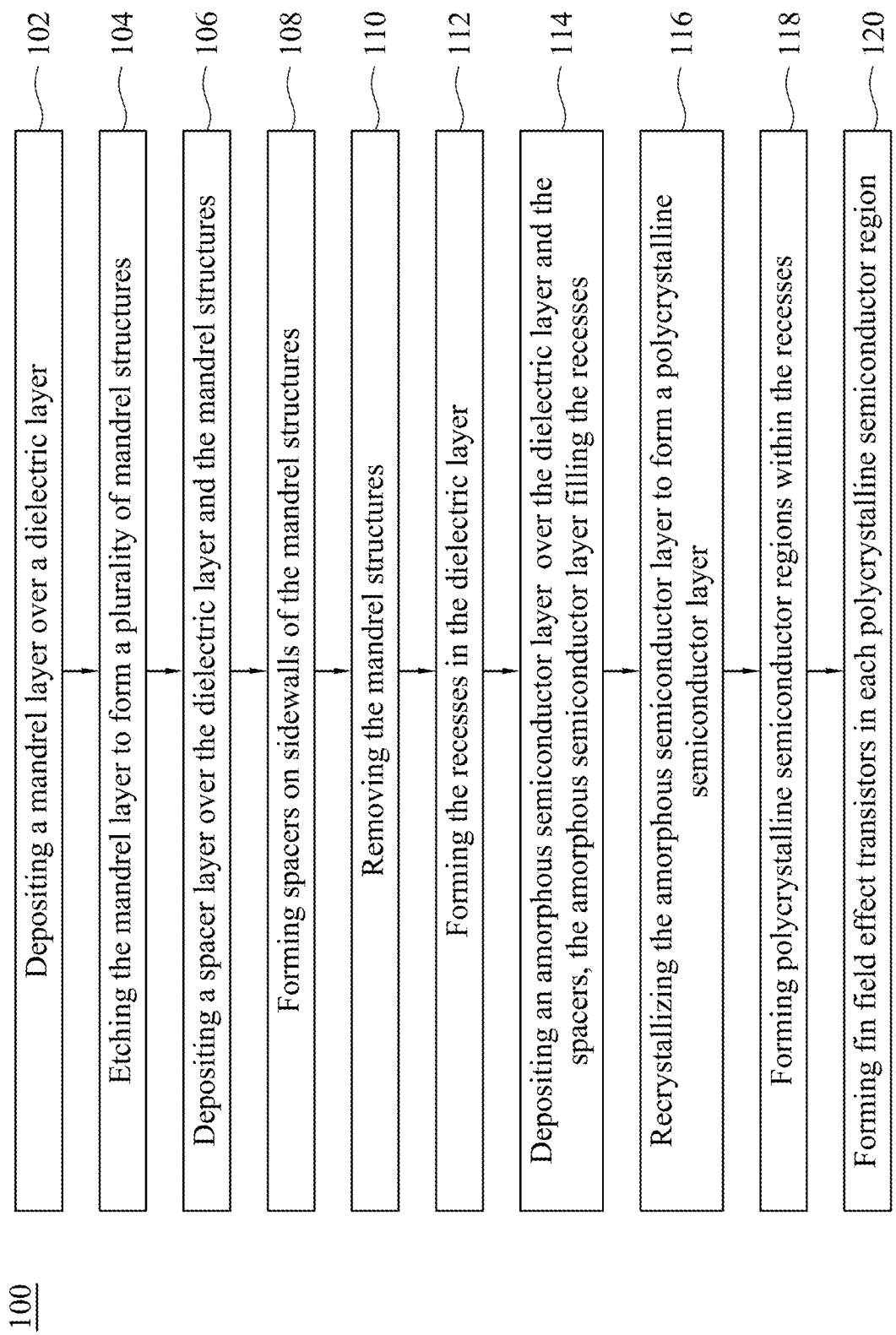
FIG. 1 is a flowchart of a method for fabricating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Laser annealing has been used to convert thin amorphous silicon films into polycrystalline silicon films. In a laser annealing process, a laser beam is irradiated to an amorphous silicon film formed on a substrate to heat and melt the amorphous silicon film. Thereafter, the amorphous silicon film is crystallized into a polycrystalline silicon film as the heated amorphous silicon film cools. One issue with such polycrystalline silicon film that is formed using the laser annealing is the random positions of grain boundaries, which leads to low carrier mobility and large device-to-device variations.

In order to help to enhance carrier mobility and to improve device performance, methods capable of producing large grained polycrystalline semiconductor regions with controlled position and number of grain boundaries as channels for thin film transistors are provided. The locations of grain boundaries are controlled by performing lateral recrystallization of an amorphous semiconductor material from sidewalls of recesses defined within a dielectric layer. Because methods of the present disclosure allow forming polycrystalline semiconductor regions having large-size grains and at the same time allow controlling the position and number of the grain boundaries, the performance, stability and reliability of thin film transistors built on such polycrystalline semiconductor regions are improved. In the meanwhile, the uniformity of the characteristics of thin film transistors over the whole area of a substrate is also improved.

FIG. 1 is a flowchart of a method 100 for fabricating a semiconductor device 200, in accordance with some embodiments. FIGS. 2A-11 illustrate views of the semiconductor device 200 at various stages of fabrication according to the method 100 of FIG. 1. The semiconductor device 200 is described with reference to FIGS. 2A-11. In some embodiments, additional operations are performed before, during, or after the method 100, or some of the operations described are replaced or eliminated. In some embodiments, additional features are added to the semiconductor device 200. In some embodiments, some of the features described below with respect to the semiconductor device 200 are replaced or eliminated. One of ordinary skill in the art would understand that although some embodiments are discussed with operations performed in a particular order, these operations may be performed in another logical order.

Figure 2A:
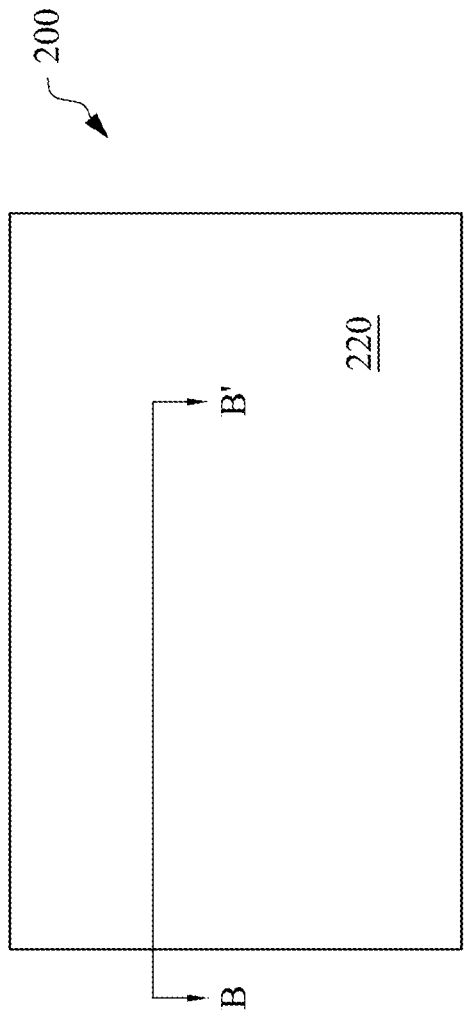
FIG. 2A is a top view of a semiconductor device after forming a mandrel layer over a dielectric layer on a substrate, in accordance with some embodiments.
Figure 2B:
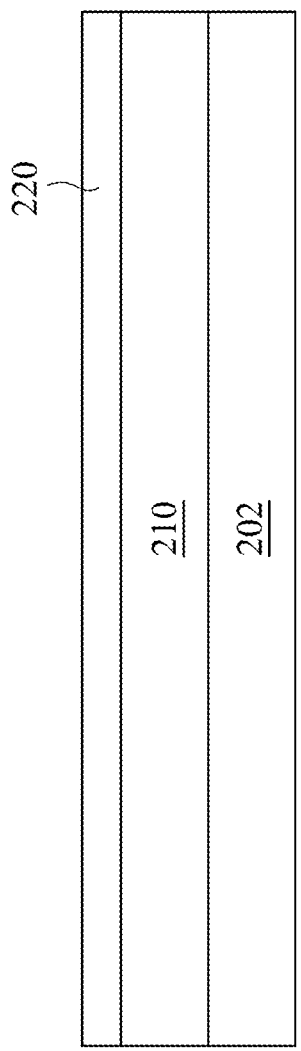
FIG. 2B is a cross-sectional view of the semiconductor device of FIG. 2A along line B-B'.

Referring to FIG. 1, the method 100 includes operation 102, in which a material stack including a dielectric layer 210 and a mandrel layer 220 is formed over a substrate 202. FIG. 2A is top view of the semiconductor device 200 after forming a material stack of the dielectric layer 210 and the mandrel layer 220 over the substrate 202, in accordance with some embodiments. FIG. 2B is a cross-sectional view of the semiconductor device 200 of FIG. 2A taken along line B-B'.

Referring to FIGS. 2A and 2B, the substrate 202 is provided. In some embodiments, the substrate 202 is a semiconductor substrate including one or more semiconductor materials. In some embodiments, the substrate 202 is a silicon substrate. In some embodiments, the substrate 202 is a glass substrate, a quartz substrate, or a polymer substrate.

Figure 10A:
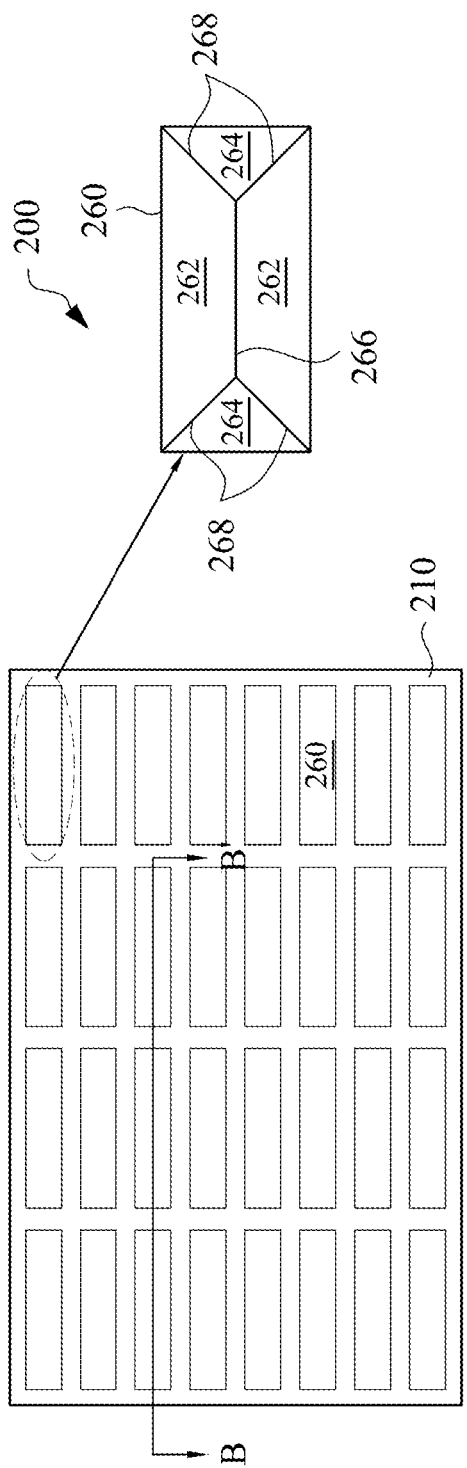
FIG. 10A is a top view of the semiconductor device of FIGS. 9A-9C after forming polycrystalline semiconductor regions within recesses, in accordance with some embodiments.
Figure 10B:
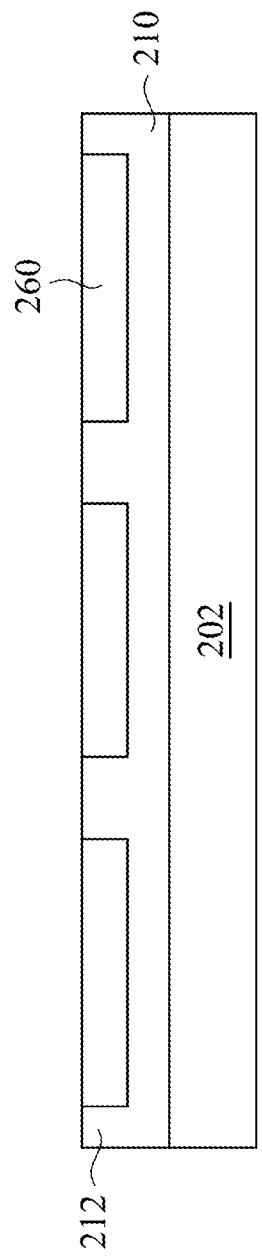
FIG. 10B is a cross-sectional view of the semiconductor device of FIG. 10A along line B-B'.

The dielectric layer 210 is deposited over the substrate 202. In some embodiments, the dielectric layer 210 includes silicon dioxide, silicon nitride, silicon oxynitride, or a combination thereof. In some embodiments, the dielectric layer 210 is deposited, for example, by chemical vapor deposition (CVD), physical vapor deposition (PVD), plasma enhanced chemical vapor deposition (PECVD), atomic layer deposition (ALD), or other suitable deposition processes. In some embodiments, the dielectric layer 210 is formed by conversion of a topmost portion of the substrate 202 using thermal oxidation, thermal nitridiation, plasma oxidation, plasma nitridation, or a combination thereof. The dielectric layer 210 is formed to a thickness that is sufficient for formation of polycrystalline semiconductor regions 260 therein (FIGS. 10A and 10B). In some embodiments, the thickness of the dielectric layer 210 is from about 1 micrometer ($\mu m$) to about 3 $\mu m$.

The mandrel layer 220 is deposited over the dielectric layer 210. The mandrel layer 220 includes a material that has a high etching selectivity with respect to the dielectric material of the underlying dielectric layer 210. In some embodiments, the mandrel layer 220 includes silicon dioxide, silicon nitride or a dielectric metal oxide. Examples of dielectric metal oxide include, but are not limited to, $HfO_2$, $ZrO_2$, $La_2O_3$, $Al_2O_3$, $TiO_2$, $SrTiO_3$, $LaAlO_3$, and $Y_2O_3$. The mandrel layer 220 is deposited, for example, by CVD, PVD, PECVD, ALD, or other suitable deposition processes.

Figure 3A:
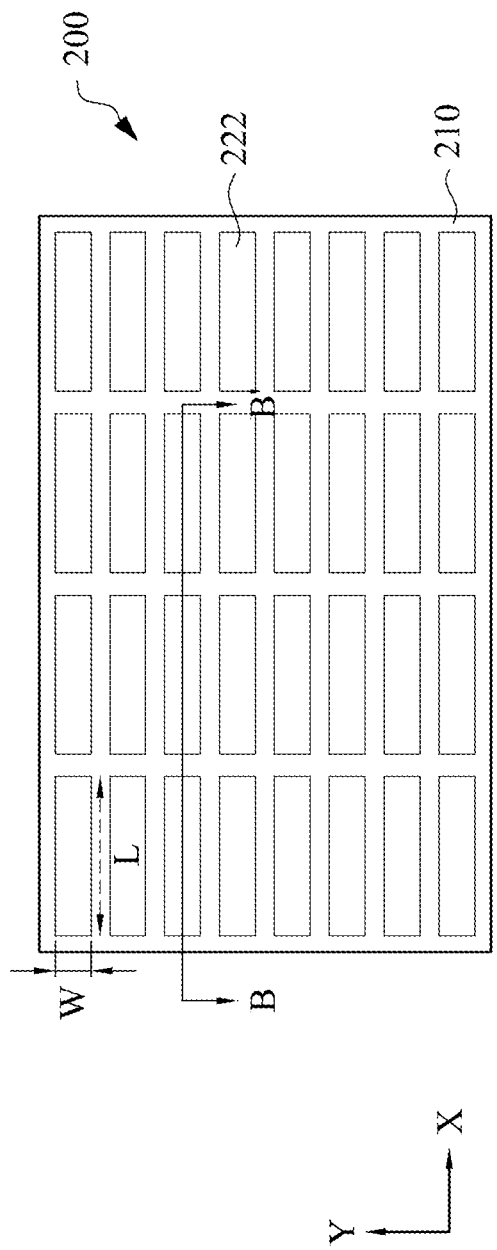
FIG. 3A is a top view of the semiconductor device of FIGS. 2A and 2B after forming a plurality of mandrel structures, in accordance with some embodiments.
Figure 3B:
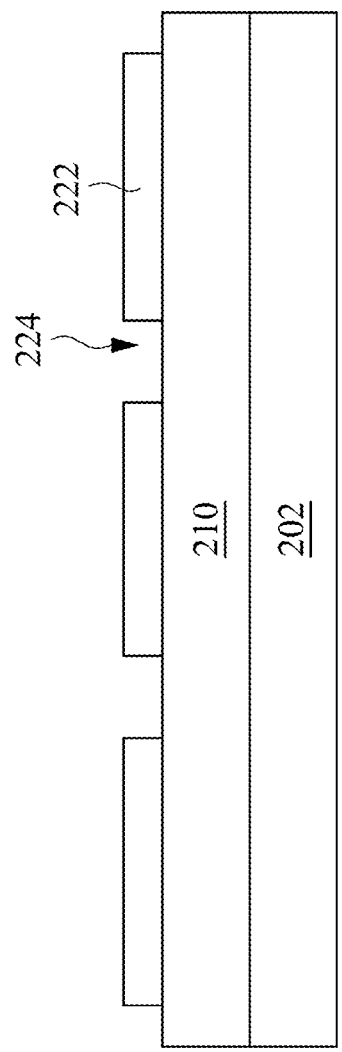
FIG. 3B is a cross-sectional view of the semiconductor device of FIG. 3A along line B-B'.

Referring to FIG. 1, the method 100 proceeds to operation 104, in which the mandrel layer 220 is etched to form a plurality of mandrel structures 222 over the dielectric layer 210. FIG. 3A is a top view of the semiconductor device 200 of FIGS. 2A and 2B after forming the plurality of mandrel structures 222 over the dielectric layer 210, in accordance with some embodiments. FIG. 3B is a cross-sectional view of the semiconductor device 200 of FIG. 3A taken along line B-B'. The mandrel structures 222 define locations of recesses 234 (FIGS. 7A and 7B) within which the lateral crystalline growth occurs. The mandrel structures 222 thus are dummy structures and will be removed at a later fabrication stage.

Referring to FIGS. 3A and 3B, each of the mandrel structures 222 extends lengthwise in a first direction, e.g., X direction, and widthwise in a second direction, e.g., Y direction. In some embodiments, the X direction is perpendicular to the Y direction. In some embodiments, the mandrel structures 222 are arranged into an ordered array, such as in a plurality of rows and/or columns. However, it is understood that in some embodiments, the mandrel structures 222 are arranged in non-regular or non-orthogonal configurations. In some embodiments, the mandrel structures 222 have rectangular shapes as seen from a plan view. In some embodiments, the rectangular shapes are the same across the plurality of mandrel structures 222. However, it is understood that in some embodiments, the mandrel structures 222 have non-rectangular shapes, and in some embodiments, the mandrel structures 222 have different shapes.

The dimension of the mandrel structures 222 determines the size of crystal grains and locations of grain boundaries formed in the later crystallization process. The length L of the mandrel structures 222 is chosen to be commensurate to the maximum length of crystal grains that are to be formed (FIGS. 10A and 10B). The width W of the mandrel structures 222 is chosen to be small enough to avoid small grain nucleation within the melted zone, yet large enough to maximize lateral crystalline growth. In some embodiments, the width of each mandrel structure 222 is defined to be equal to or less than twice the maximum lateral grain growth length such that crystal grains growing from opposite lengthwise sidewalls of each recess 234 impinge at the middle of each recess 234 during the crystallization process. In some embodiments, each of the mandrel structures 222 has a length L ranging from about 2 $\mu m$ to about 4 $\mu m$ and a width W ranging from about 1 $\mu m$ to about 2 $\mu m$. In some embodiments, the mandrel structures 222 are formed to have a same dimension. In some embodiments, the mandrel structures 222 are formed to have different dimensions.

The mandrel structures 222 are formed by patterning the mandrel layer 220 using a lithography and etching process. For example, a photoresist layer (not shown) is first applied over the mandrel layer 220. The photoresist layer is lithographically patterned to define a set of areas corresponding to the locations of the mandrel structures 222. The pattern in the photoresist layer is then transferred into the mandrel layer 220 by an anisotropic etch. In some embodiments, the anisotropic etch is a dry etch such as reactive ion etch (RIE) or plasma etch, a wet etch, or a combination thereof. The patterned portions of the mandrel layer 220 constitute the mandrel structures 222. The mandrel structures 222 define a plurality of openings 224. The openings 224 expose portions of the dielectric layer 210 at the bottom of the openings 224.

Figure 4A:
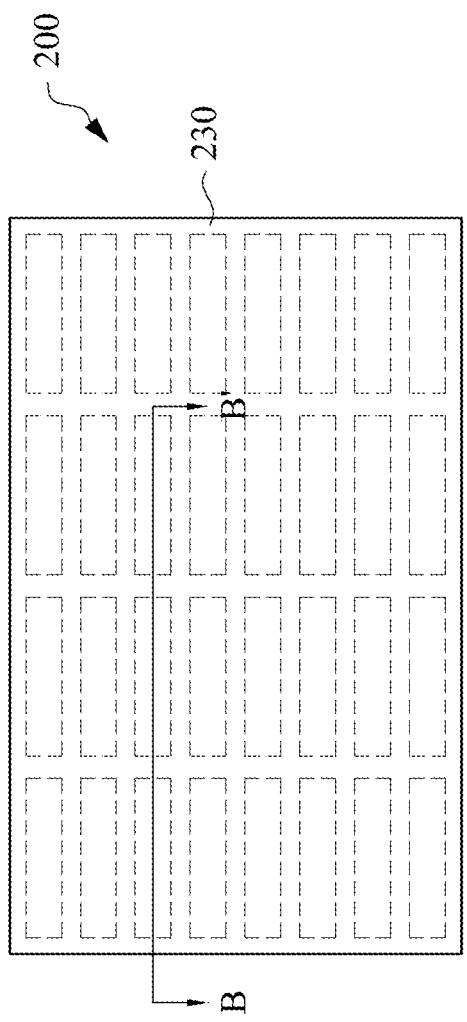
FIG. 4A is a top view of the semiconductor device of FIGS. 3A and 3B after forming a spacer layer over the mandrel structures and the dielectric layer, in accordance with some embodiments.
Figure 4B:
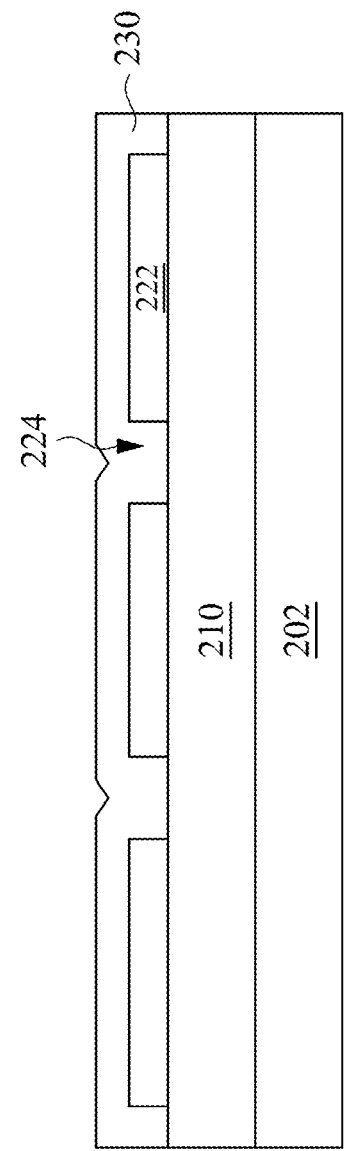
FIG. 4B is a cross-sectional view of the semiconductor device of FIG. 4A along line B-B'.

Referring to FIG. 1, the method 100 proceeds to operation 106, in which a spacer layer 230 is deposited over the dielectric layer 210 and the mandrel structures 222. FIG. 4A is a top view of the semiconductor device 200 of FIGS. 3A and 3B after depositing the spacer layer 230 over the dielectric layer 210 and the mandrel structures 222, in accordance with some embodiments. FIG. 4B is a cross-sectional view of the semiconductor device 200 of FIG. 4A taken along line B-B'.

Referring to FIGS. 4A and 4B, the spacer layer 230 is deposited over the dielectric layer 210 and the mandrel structures 222. In some embodiments, the spacer layer 230 is conformally deposited over the dielectric layer 210 and the mandrel structures 222 such that the thickness of the spacer layer 230 on the top surfaces of the dielectric layer 210 and the thickness of the spacer layer 230 on the sidewalls of the mandrel structures 222 are substantially the same. In some embodiments, the thickness of the spacer layer 230 is selected to be equal to or greater than a half of width of openings 224. As a result, the vertical portions of the spacer layer 230 on opposite sidewalls of the mandrel structures 222 are merged with each other to fill the openings 224. The spacer layer 230 includes any suitable material that has different etching selectivity with respect to the material of the mandrel structures 222 such that the mandrel structures 222 can be selectively removed in a later process. In some embodiments, the spacer layer 230 includes an amorphous semiconductor material such as amorphous silicon, amorphous germanium, or amorphous silicon germanium. In some embodiments, the spacer layer 230 includes a dielectric material such as silicon dioxide or silicon nitride. In some embodiments, the spacer layer 230 is deposited by CVD, low pressure chemical vapor deposition (LPCVD), ALD, or other suitable deposition processes. In some embodiments, the spacer layer 230 includes amorphous silicon and is formed by a LPCVD process employing at least one silicon-containing precursor such as silane ($SiH_4$), disilane ($Si_2H_6$), trisilane ($Si_3H_8$), and dichlorosilane ($SiH_2Cl_2$).

Referring to FIG. 1, the method 100 proceeds to operation 108, in which spacers 232 are formed on sidewalls of the mandrel structures 222. FIG. 5A is a top view of the semiconductor device 200 of FIGS. 4A and 4B after forming spacers 232 on sidewalls of the mandrel structures 222, in accordance with some embodiments. FIG. 5B is a cross-sectional view of the semiconductor device 200 of FIG. 5A taken along line B-B'.

Referring to FIGS. 5A and 5B, the spacers 232 are present on the sidewalls of the mandrel structures 222. The spacers 232 between adjacent mandrel structures 222 are merged to fill the openings 224. In some embodiments, the spacers 232 are formed by performing an anisotropic etch that removes the horizontal portions of the spacer layer 230, while leaving the vertical portions of the spacer layer 230 intact. In some embodiments, the anisotropic etch is a dry etch such as RIE, a wet etch, or a combination thereof. The anisotropic etch removes the material of the spacer layer 230 selective to the material of the mandrel structures 222. The remaining vertical portions of the spacer layer 230 constitute the spacers 232. After removing the horizontal portions of the spacer layer 230, top surfaces of the mandrel structures 222 are exposed.

Figure 6A:
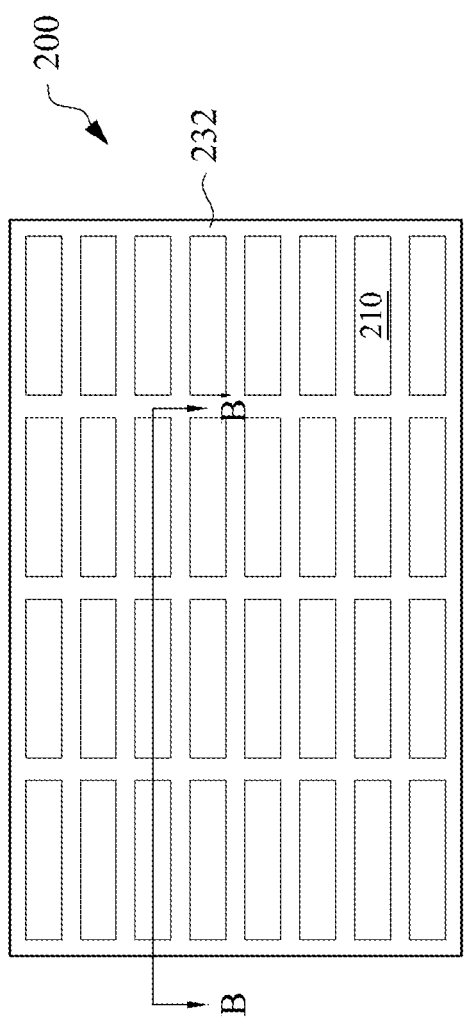
FIG. 6A is a top view of the semiconductor device of FIGS. 5A and 5B after removing mandrel structures, in accordance with some embodiments.
Figure 6B:
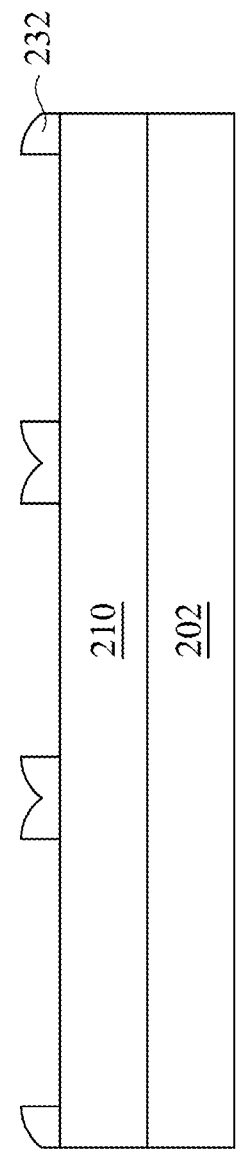
FIG. 6B is a cross-sectional view of the semiconductor device of FIG. 6A along line B-B'.

Referring to FIG. 1, the method 100 proceeds to operation 110, in which the mandrel structures 222 are removed, leaving the spacers 232 protruding outward from the dielectric layer 210. FIG. 6A is a top view of the semiconductor device 200 of FIGS. 5A and 5B after removing the mandrel structures 222, leaving the spacers 232 protruding outward from the dielectric layer 210, in accordance with some embodiments. FIG. 6B is a cross-sectional view of the semiconductor device 200 of FIG. 6A taken along line B-B'.

Referring to FIGS. 6A and 6B, the mandrel structures 222 are removed from between the spacers 232. In some embodiments, an anisotropic etch such as RIE is performed to remove the mandrel structures 222 selective to the spacers 232 and the dielectric layer 210. In some embodiments, an isotropic etch such as a wet etch using an etchant solution is performed to remove the mandrel structures 222 selective to the spacers 232 and the dielectric layer 210. The removal of the mandrel structures 222 exposes portions of the dielectric layer 210 underneath the mandrel structures 222. After removal of the mandrel structures 222, the spacers 232 remains on the dielectric layer 210, protruding from the surface of the dielectric layer 210.

Referring to FIG. 1, the method 100 proceeds to operation 112, in which recesses 234 are formed in the dielectric layer 210. FIG. 7A is top view of the semiconductor device 200 of FIGS. 6A and 6B after forming the recesses 234 in the dielectric layer 210, in accordance with some embodiments. FIG. 7B is a cross-sectional view of the semiconductor device 200 of FIG. 7A taken along line B-B'.

Referring to FIGS. 7A and 7B, an anisotropic etch process is performed to remove portions of the dielectric layer 210 that are not covered by the spacers 232, forming the recesses 234 within the dielectric layer 210. In some embodiments, the anisotropic etch includes a dry etch such as RIE, a wet etch, or a combination thereof. The recesses 234 define areas in the dielectric layer 210 within which lateral crystalline growth occurs. In some embodiments, the recesses 234 are formed to have a rectangular shape in plan view. The recesses 234 extend a depth into the dielectric layer 210. The depth of the recesses 234 determines the height of polycrystalline semiconductor regions 260 (FIGS. 10A and 10B) subsequently formed. In some embodiments, the recesses 234 extend a depth of about 10 nm to about 200 nm into the dielectric layer 210. The recesses 234 are surrounded by a plurality of protruding portions 212 extending from a surface of the dielectric layer 210.

Figure 8C:
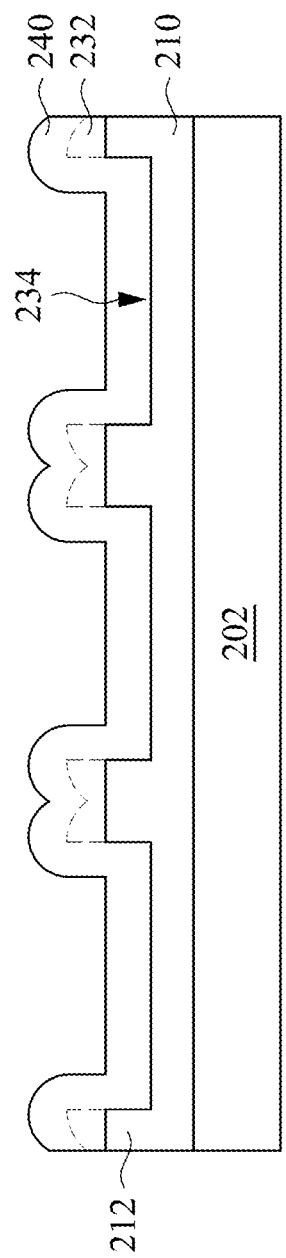

Referring to FIG. 1, the method 100 proceeds to operation 114, in which an amorphous semiconductor layer 240 is deposited over the dielectric layer 210 and the spacers 232. FIG. 8A is a top view of the semiconductor device 200 of FIGS. 7A and 7B after depositing the amorphous semiconductor layer 240 over the dielectric layer 210 and the spacers 232, in accordance with some embodiments. FIGS. 8B and 8C are cross-sectional views of the semiconductor device 200 of FIG. 8A taken along line B-B'.

Referring to FIGS. 8A-8B, the amorphous semiconductor layer 240 is conformally deposited over the spacers 232 and the dielectric layer 210 such that the thickness of horizontal portions of the amorphous semiconductor layer 240 and the thickness of vertical portions of the amorphous semiconductor layer 240 are substantially the same. In some embodiments, the horizontal thickness of the amorphous semiconductor layer 240 is selected to be equal to or greater than the depth of the recess 234. Accordingly, the amorphous semiconductor layer 240 completely fills the recesses 234. The amorphous semiconductor layer 240 includes an amorphous semiconductor material such as amorphous silicon, amorphous germanium, or amorphous silicon germanium. In some embodiments and as in FIG. 8C, the amorphous semiconductor layer 240 includes an amorphous semiconductor material the same as the amorphous semiconductor material providing the spacers 232. For example, in some embodiments, both spacers 232 and the amorphous semiconductor layer 240 include amorphous silicon. The dotted lines in FIG. 8C depicted between the spacers 232 and the amorphous semiconductor layer 240 indicate that in instances where the amorphous semiconductor layer 240 and the spacers 232 include a same semiconductor material, the interfaces between the respective spacers 232 and the amorphous semiconductor layer 240 are not discernible. In some embodiments, the amorphous semiconductor layer 240 is deposited, for example, by LPCVD or other deposition processes suitable for creating an amorphous semiconductor layer. In some embodiments, the amorphous semiconductor layer 240 includes amorphous silicon and is formed by a LPCVD process employing at least one silicon-containing precursor such as silane ($SiH_4$), disilane ($Si_2H_6$), trisilane ($Si_3H_8$), and dichlorosilane ($SiH_2Cl_2$).

Figure 9A:
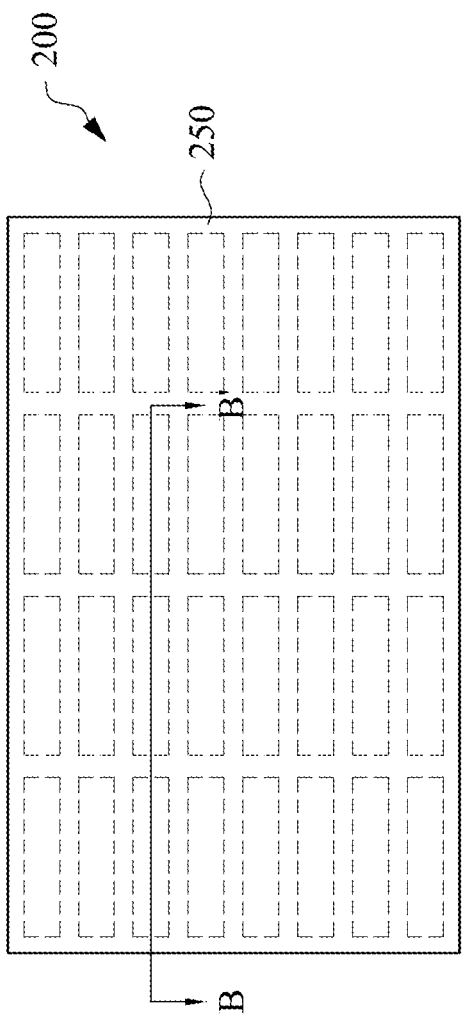
FIG. 9A is a top view of the semiconductor device of FIGS. 8A-8C after recrystallizing the amorphous semiconductor layer to form a polycrystalline semiconductor layer, in accordance with some embodiments.
Figure 9B:
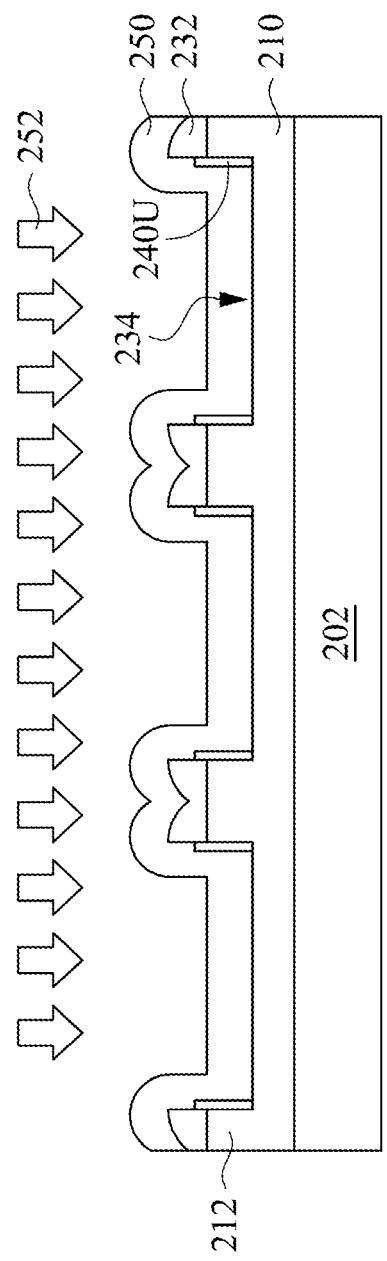
FIGS. 9B and 9C are cross-sectional views of the semiconductor device of FIG. 9A along line B-B'.
Figure 9C:
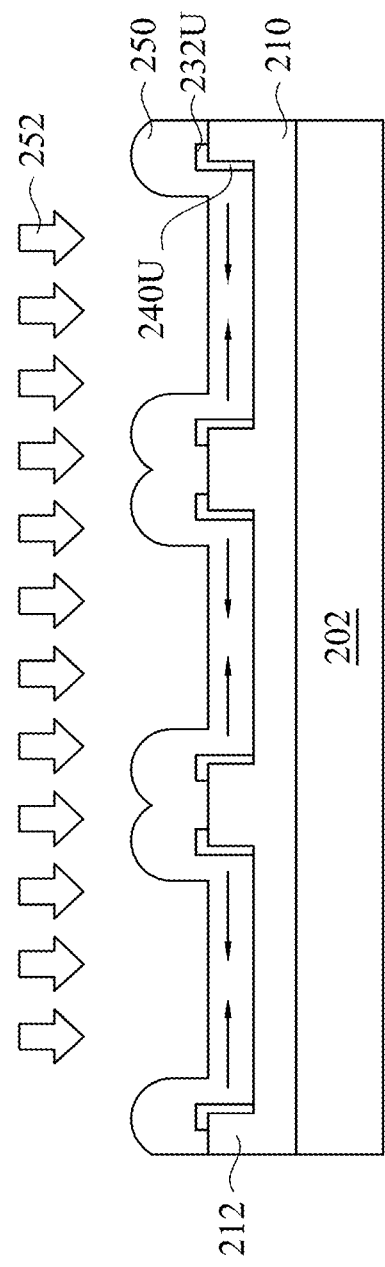

Referring to FIG. 1, the method 100 proceeds to operation 116, in which the amorphous semiconductor layer 240 is recrystallized to form a polycrystalline semiconductor layer 250. FIG. 9A is a top view of the semiconductor device 200 of FIGS. 8A-8C after recrystallizing the amorphous semiconductor layer 240 to form the polycrystalline semiconductor layer 250, in accordance with some embodiments. FIGS. 9B and 9C are cross-sectional views of the semiconductor device 200 of FIG. 9A taken along line B-B'.

Referring to FIGS. 9A-9C, a crystallization process is performed to convert the amorphous semiconductor layer 240 into the polycrystalline semiconductor layer 250. In some embodiments, the crystallization process is carried out by a laser annealing process in which the amorphous semiconductor layer 240 and the spacers 232 are subjected to a laser beam irradiation. During the laser annealing process, the amorphous semiconductor layer 240 and the spacers 232 are irradiated with laser beams 252 from a laser such as an excimer laser, a continuous wave laser, or a beam pulse laser. In some embodiments, a Nd:$YVO_4$ continuous wave laser is used. The laser beams 252 melt the amorphous semiconductor layer 240, and the recrystallization of the amorphous semiconductor layer 240 begins as the structure cools down after the laser beam irradiation is stopped. The power density and duration of the laser irradiation are controlled such that the horizontal portions of the amorphous semiconductor layer 240 are completely melted. Meanwhile, the vertical portions of the amorphous semiconductor layer 240 is only partially melted. In some embodiments, a laser power density in the range of about 0.1 W/cm$^2$ to about 10 W/cm$^2$ is used to melt silicon with a thickness greater than 500 angstroms (Å). The wavelength of the laser beams 252 is chosen to be a wavelength that is absorbable by the amorphous semiconductor material being melted. In some embodiments, a wavelength of 532 nm is used when the amorphous semiconductor layer 240 comprises silicon. The partial melting of the amorphous semiconductor layer 240 creates unmelted portions 240U adjacent to the sidewalls of the protruding portions 212 of the dielectric layer 210 (i.e., sidewalls of the recesses 234) due to the presence of the spacers 232 that increases the height of the vertical portions of the amorphous semiconductor layer 240. The unmelted portions 240U of the vertical portions of the amorphous semiconductor layer 240 serve as the nucleation seeds to promote the lateral crystalline growth of the molten portions of the amorphous semiconductor layer 240 within the recesses 234. In some embodiments and as in FIG. 9B, in instances where the spacers 232 include a dielectric material, the laser beams 252 only melt the amorphous semiconductor layer 240, while the spacers 232 are intact. In some embodiments and as in FIG. 9C, in instances where the spacers 232 include an amorphous semiconductor material, in addition to melting the amorphous semiconductor layer 240, the laser beams 252 partially melt the spacers 232 buried underneath the horizontal portions of the amorphous semiconductor layer 240, generating unmelted spacer portions 232U adjacent to the top surfaces of the protruding portions 212 of the dielectric layer 210. The unmelted spacer portions 232U also serve as nucleation seeds to promote a transverse crystalline growth of the amorphous semiconductor material along a direction perpendicular to the top surfaces of the protruding portions 212 of the dielectric layer 210.

After the laser irradiation is ceased, the melted portions of the amorphous semiconductor layer 240 within each recesses 234 is recrystallized starting from sides of the unmelted portions 240U. The crystal grains thus grow from the unmelted portions 240U on the sidewalls of the recesses 234 laterally toward the centers of recesses 234, as indicated by arrows. The growth of crystal grains within each recess 234 is stopped when the fronts of the crystal grains collide with one another, forming grain boundaries. Meanwhile, above the protruding portions 212 of the dielectric layer 210, crystal grains grow from the interfaces between the spacers 232 and the melted portions of the amorphous semiconductor layer 240 (FIG. 9B) or from the unmelted spacer portions 232U (FIG. 9C) upwardly in directions away from the protruding portions 212 of the dielectric layer 210. As a result, the polycrystalline semiconductor layer 250 is formed from the amorphous semiconductor layer 240 (FIG. 9B) or a combination of the amorphous semiconductor layer 240 and spacers 232 (FIG. 9C). The polycrystalline semiconductor layer 250 is formed to have first portions embedded within the recesses 234 and second portions above the protruding portions 212 of the dielectric layer 210.

In the present disclosure, by forming recesses 234 to define lateral crystalline growth regions and by forming spacers 232 to generate nucleation seeds on all four sidewalls of the recesses 234 for inducing lateral crystalline growth, the sizes of crystal grains and locations of grain boundaries of the resulting polycrystalline semiconductor layer 250 within the recesses 234 are controllable. The polycrystalline semiconductors with large grain size and controlled grain boundary locations help to produce thin film transistors with improved carrier mobility and reliability.

Referring to FIG. 1, the method 100 proceeds to operation 118, in which polycrystalline semiconductor regions 260 are formed within the recesses 234. FIG. 10A is a top view of the semiconductor device 200 of FIGS. 9A-9C after forming polycrystalline semiconductor regions 260 within the recesses 234, in accordance with some embodiments. FIG. 10B is a cross-sectional view of the semiconductor device 200 of FIG. 10A taken along line B-B'.

Referring to FIGS. 10A and 10B, the polycrystalline semiconductor regions 260 are embedded within the recesses 234 and have top surfaces coplanar with the top surfaces of the protruding portions 212 of the dielectric layer 210. The polycrystalline semiconductor regions 260 are formed by performing a planarization process that remove portions of the polycrystalline semiconductor layer 250 from the top surfaces of the protruding portions 212 of the dielectric layer 210. Portions of the polycrystalline semiconductor layer 250 remaining in the recesses 234 constitute the polycrystalline semiconductor regions 260. In some embodiments, the planarization process includes a chemical mechanical polishing process or an etch process. In instances wherein the spacers 232 are composed of a dielectric material, the planarization process also removes the spacers 232 from the top surface of the protruding portions 212 of the dielectric layer 210.

As shown in an enlarged view of the polycrystalline semiconductor region 260 in FIG. 10A, each polycrystalline semiconductor region 260 includes a pair of first crystal grains 262 growing from lengthwise sidewalls of the corresponding recess 234 and a pair of second crystal grains 264 grown from widthwise sidewalls of the corresponding recess 234. The first crystal grains 262 are separated from each other by a grain boundary 266, and are separated from the respective second crystal grains 264 by grain boundaries 268. The grain boundary 266 corresponds to the center of the corresponding recess 234. The dimension of the recesses 234 are set such that the size of each first crystal grain 262 is large enough to accommodate a channel of a thin film transistor. Because there are no grain boundaries within the channel of the thin film transistor in each first crystal grain 262, carrier mobility in the channel of the resulting transistor is increased and response speed of the transistor is improved.

After forming polycrystalline semiconductor regions 260 within the recesses 234, the semiconductor device 200 can continue with processing to complete fabrication as discussed briefly below.

Figure 11:
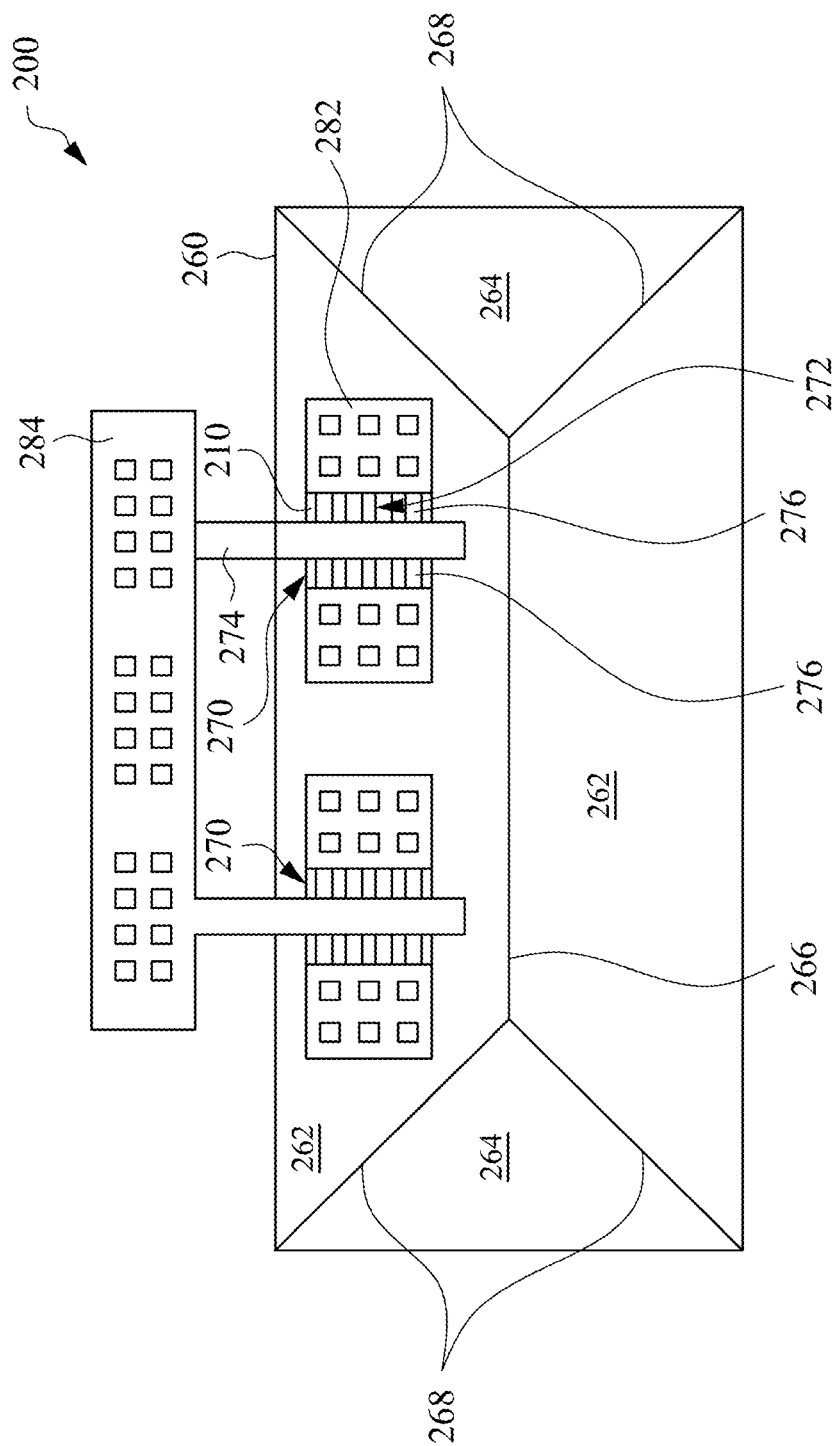
FIG. 11 is a top view of the semiconductor device of FIGS. 10A and 10B after forming fin field effect transistors (FinFETs) within each polycrystalline semiconductor region, in accordance with some embodiments.

Referring to FIG. 1, the method 100 proceeds to operation 120, in which one or more fin field effect transistors (FinFETs) 270 are formed within a crystal grain 262 of each polycrystalline semiconductor region 260. FIG. 11 is a top view of the semiconductor device 200 of FIGS. 10A and 10B after forming one or more FinFETs 270 within a first crystal grain 262 of each polycrystalline semiconductor region 260, in accordance with some embodiments.

Referring to FIG. 11, each FinFET 270 includes a plurality of semiconductor fins 272, a gate structure 274 straddling a channel portion of each semiconductor fin 272, and source/drain regions 276 within portions of each semiconductor fin 272 on opposite sides of the gate structure 274. Although FIG. 11 shows each FinFET 270 includes multiple semiconductor fins 272, it is understood that in some embodiments, each FinFET 270 includes a single semiconductor fin.

The semiconductor fins 272 are formed by patterning each polycrystalline semiconductor region 260. In some embodiments, each polycrystalline semiconductor regions 260 is patterned using suitable lithography and etching processes. For example, a mask layer (not shown) is applied over the polycrystalline semiconductor regions 260 and the dielectric layer 210 and lithographically patterned to define a set of areas where semiconductor fins 272 are to be formed. In some embodiments, the mask layer is a photoresist layer. In some embodiments, the mask layer is a photoresist layer in conjunction with hardmask layer(s). The polycrystalline semiconductor regions 260 are then patterned by an anisotropic etch using the patterned mask layer as an etch mask. In some embodiments, a dry etch such as, for example, RIE or a plasma etch is used. In some embodiments, a wet etch using a chemical etchant is used. In still some further embodiments, a combination of dry etch and wet etch is used. After formation of the semiconductor fins 272, the patterned mask layer is removed, for example, by oxygen plasma or ashing. Alternatively, in some embodiments, the semiconductor fins 272 are formed utilizing a sidewall image transfer (SIT) process. In a SIT process, spacers are formed on mandrel structures. The mandrel structures are removed and the remaining spacers are used as a hard mask to etch the polycrystalline semiconductor regions 260. The spacers are then removed after semiconductor fins 272 are formed. In some embodiments, sequential SIT processes are utilized to form semiconductor fins 272 with highly scaled fin width and pitches.

The gate structure 274 is formed on and straddle channel portions of respective semiconductor fins 272. The gate structure 274 includes a gate stack and gate spacers surrounding the gate stack. In some embodiments, the gate stack includes a gate dielectric, a gate electrode, and a gate cap. In some embodiments, the gate dielectric includes silicon oxide, silicon nitride, silicon oxynitride, or a combination thereof. Alternately or additionally, in some embodiments, the gate dielectric includes a high dielectric constant (high-k) dielectric material having a dielectric constant greater than silicon oxide. Exemplary high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanate ($SrTiO_3$), lanthanum aluminate ($LaAlO_3$), and yttrium oxide ($Y_2O_3$). In some embodiments, the gate electrode includes an electrically conductive material such as tungsten (W), copper (Cu), titanium (Ti), tantalum (Ta), aluminum (Al), nickel (Ni), ruthenium (Ru), palladium (Pd), platinum (Pt), a metal nitride such as titanium nitride (TiN), tungsten nitride (WN), titanium aluminum nitride (TiAlN), or tantalum carbon nitride (TaCN), an alloy, or combinations thereof. In some embodiments, the gate cap includes a dielectric material such as, for example, silicon nitride, silicon carbide, silicon oxynitride, silicon oxycarbide, other suitable dielectric materials, or combinations thereof.

The gate stack is formed by deposition and patterning of gate stack layers including a gate dielectric layer, a gate electrode layer, and a gate cap layer. In some embodiments, the patterning of the gate stack layers is effected by application of a photoresist layer (not shown), lithographic patterning of the photoresist layer, transfer of the pattern in the photoresist layer into the gate stack layers, and removal of the patterned photoresist layer, for example, by ashing. In some embodiments, the materials of the gate stacks are sacrificial materials that are subsequently removed, and are replaced with functional gate stacks including functional gate dielectrics and functional gate electrodes after formation of source/drain regions 276 for each FinFET 270.

The gate spacers are formed on sidewalls of the gate stack. In some embodiments, the gate spacers are utilized to offset subsequently formed doped regions, such as source/drain regions 276. In some embodiments, the gate spacers include a dielectric material such as, for example, silicon nitride, silicon carbide, silicon oxynitride, silicon oxycarbide, other suitable dielectric materials, or combinations thereof. In some embodiments, the gate spacers are formed, for example, by deposition of a conformal dielectric material layer and selective removal of horizontal portions of the deposited conformal dielectric material layer. The remaining vertical portions of the deposited conformal dielectric material layer constitute the gate spacers.

The source/drain regions 276 are doped semiconductor regions. In some embodiments, the source/drain regions 276 include p-type dopants such as, for example, boron for a p-type FinFET. In some embodiments, the source/drain regions 276 include n-type dopants such as, for example, arsenic or phosphorus for an n-type FinFET. In some embodiments, the source/drain regions 276 are formed by implanting dopants into portions of the semiconductor fins 272 that are not covered by the gate structure 274 using, for example, ion implantation. In some embodiments, the source/drain regions 276 are raised source/drain regions 276 formed by epitaxially depositing a semiconductor material over portions of each semiconductor fin 272 on opposite sides of the gate structure 274.

The semiconductor device 200 also includes additional features, which are formed by subsequent processing. For example, subsequently processing further forms source/drain contact structures 282 for providing electrical connections to source/drain regions of each FinFET 270 and a gate contact structure 284 configured to connect gate structures 274 of adjacent FinFETs 270 formed within the same crystal grain 262. The various contact structures 282, 284 are implemented by various conductive materials including copper, tungsten, cobalt, and/or silicide. In some embodiments, a damascene and/or dual damascene process is used to form various contact structures 282, 284.

During operation of FinFETs 270, current flows between the source/drain contact structures 282. Because the current does not flow cross the grain boundaries 266 and 268, mobility in each FinFET 270 is substantially equivalent to the case of constitution with a single crystal. As a result, the performance and reliability of the device are improved. In addition, forming polycrystalline semiconductor regions 260 with controlled grain sizes and grain boundaries helps to eliminate performance variation of FinFETs 270 formed in different polycrystalline semiconductor regions 260.

One aspect of this description relates to a method for forming a polycrystalline semiconductor layer. The method includes forming a plurality of spacers over a dielectric layer. The method further includes etching the dielectric layer using the plurality of spacers as an etch mask to form a recess in the dielectric layer. The method further includes depositing an amorphous semiconductor layer over the plurality of spacers and the dielectric layer. The amorphous semiconductor layer fills the recess. The method further includes recrystallizing the amorphous semiconductor layer to form a polycrystalline semiconductor layer. In some embodiments, the method further includes forming a polycrystalline semiconductor region within the recess by removing portions of the polycrystalline semiconductor layer from top surfaces of protruding portions of the dielectric layer surrounding the recess. In some embodiments, recrystallizing the amorphous semiconductor layer includes annealing the amorphous semiconductor layer using laser beams. In some embodiments, annealing the amorphous semiconductor layer includes using continuous wave laser beams and pulsed laser beams. In some embodiments, annealing the amorphous semiconductor layer includes irradiating the amorphous semiconductor layer and the plurality of spacers to completely melt horizontal portions of the amorphous semiconductor layer, while partially melting vertical portions of the amorphous semiconductor layer on sidewalls of the recess. In some embodiments, irradiating the amorphous semiconductor layer and the plurality of spacers includes irradiating the plurality of spacers comprising an amorphous semiconductor material or a dielectric material. In some embodiments, irradiating the amorphous semiconductor layer and the plurality of spacers includes partially melting the plurality of spacers when the plurality of spacers comprises the amorphous semiconductor material. In some embodiments, the method further includes ceasing the irradiation to cause recrystallization of melted portions of the amorphous semiconductor layer, wherein unmelted portions of the vertical portions of the amorphous semiconductor layer serve as nucleation seeds to cause a lateral crystalline growth of the melted portions of the amorphous semiconductor layer within the recess. In some embodiments, depositing the amorphous semiconductor layer includes depositing amorphous silicon, amorphous germanium, or amorphous silicon germanium. In some embodiments, forming the plurality of spacers includes depositing a spacer layer over the dielectric layer and a mandrel structure that is over the dielectric layer, etching the spacer layer to form the plurality of spacers on sidewalls of the mandrel structure, and removing the mandrel structure. In some embodiments, the method further includes depositing a mandrel layer over the dielectric layer. In some embodiments, the method further includes patterning the mandrel layer to form the mandrel structure. In some embodiments, depositing the amorphous semiconductor layer includes depositing a semiconductor material the same as a semiconductor material of the plurality of spacers.

Another aspect of this description relates to a method for forming a polycrystalline semiconductor layer. The method includes forming a plurality of spacers over a dielectric layer. The plurality of spacers includes an amorphous semiconductor material. The method further includes etching the dielectric layer using the plurality of spacers as an etch mask to form a recess in the dielectric layer. The method further includes depositing an amorphous semiconductor layer over the plurality of spacers and the dielectric layer. The amorphous semiconductor layer fills the recess. The method further includes irradiating the amorphous semiconductor layer and the plurality of spacers to completely melt horizontal portions of the amorphous semiconductor layer, while partially melt vertical portions of the amorphous semiconductor layer and the plurality of spacers. The partially metaling of the vertical portions of the amorphous semiconductor layer forms first unmelted portions adjacent to sidewalls of the recess, and the partially metaling of the plurality of spacers forms second unmelted portions outside of the recess. The method further includes recrystallizing a melted portion of the amorphous semiconductor layer within the recess using the first unmelted portions as nucleation seeds to form a first polycrystalline semiconductor region. The method further includes recrystallizing melted portions of the amorphous semiconductor layer outside of the recess and melted portions of the plurality of spacers using the second unmelted portions as nucleation seeds to form second polycrystalline semiconductor regions over a top surface of the dielectric layer. In some embodiments, the first polycrystalline semiconductor region completely fills the recess. In some embodiments, the first polycrystalline semiconductor region comprises a pair of first crystal grains adjacent to lengthwise sidewalls of the recess and a pair of second crystal grains adjacent to widthwise sidewalls of the recess. In some embodiments, the method further includes performing a planarization process to remove the second polycrystalline semiconductor regions from the top surface of the dielectric layer.

Still another aspect of this description relates to a method of fabricating a semiconductor device. The method includes forming a plurality of mandrel structures over a dielectric layer, depositing a spacer layer over the dielectric layer and the plurality of mandrel structures, etching the spacer layer to form a plurality of spacers between the plurality of mandrel structures, removing the plurality of mandrel structures, leaving the plurality of spacers protruding outward from the dielectric layer, forming a plurality of recesses within the dielectric layer by removing portion of the dielectric layer not covered by the plurality of spacers, depositing an amorphous semiconductor layer over the plurality of spacers and the dielectric layer to fill the plurality of recess, recrystallizing the amorphous semiconductor layer to form a polycrystalline semiconductor layer, and forming a plurality of polycrystalline semiconductor regions within the plurality of recesses by removing portions of the polycrystalline semiconductor layer outside of the plurality of recesses. In some embodiments, the method further includes patterning each polycrystalline semiconductor region of the plurality of polycrystalline semiconductor regions to form at least one semiconductor fin therein. The at least one semiconductor fin is within a region that is free of grain boundaries. In some embodiments, the method further forms a gate structure straddling a channel portion of the at least one semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a polycrystalline semiconductor layer, comprising:
   forming a plurality of spacers over a dielectric layer;
   etching the dielectric layer using the plurality of spacers as an etch mask to form a recess in the dielectric layer;
   depositing an amorphous semiconductor layer over the plurality of spacers and the dielectric layer, the amorphous semiconductor layer filling the recess; and
   recrystallizing the amorphous semiconductor layer to form the polycrystalline semiconductor layer.

2. The method of claim 1, further comprising forming a polycrystalline semiconductor region within the recess by removing portions of the polycrystalline semiconductor layer from top surfaces of protruding portions of the dielectric layer surrounding the recess.

3. The method of claim 1, wherein recrystallizing the amorphous semiconductor layer comprises annealing the amorphous semiconductor layer using laser beams.

4. The method of claim 3, wherein annealing the amorphous semiconductor layer comprises using continuous wave laser beams and pulsed laser beams.

5. The method of claim 3, wherein annealing the amorphous semiconductor layer comprises irradiating the amorphous semiconductor layer and the plurality of spacers to completely melt horizontal portions of the amorphous semiconductor layer, while partially melting vertical portions of the amorphous semiconductor layer on sidewalls of the recess.

6. The method of claim 5, wherein irradiating the amorphous semiconductor layer and the plurality of spacers comprises irradiating the plurality of spacers comprising an amorphous semiconductor material or a dielectric material.

7. The method of claim 6, wherein irradiating the amorphous semiconductor layer and the plurality of spacers comprises partially melting the plurality of spacers when the plurality of spacers comprises the amorphous semiconductor material.

8. The method of claim 5, further comprising ceasing the irradiation to cause recrystallization of melted portions of the amorphous semiconductor layer, wherein unmelted portions of the vertical portions of the amorphous semiconductor layer serve as nucleation seeds to cause a lateral crystalline growth of the melted portions of the amorphous semiconductor layer within the recess.

9. The method of claim 1, wherein depositing the amorphous semiconductor layer comprises depositing amorphous silicon, amorphous germanium, or amorphous silicon germanium.

10. The method of claim 1, wherein forming the plurality of spacers comprises:
    depositing a spacer layer over the dielectric layer and a mandrel structure that is over the dielectric layer;
    etching the spacer layer to form the plurality of spacers on sidewalls of the mandrel structure; and
    removing the mandrel structure.

11. The method of claim 10, further comprising depositing a mandrel layer over the dielectric layer.

12. The method of claim 11, further comprising patterning the mandrel layer to form the mandrel structure.

13. The method of claim 1, wherein depositing the amorphous semiconductor layer comprises depositing a semiconductor material the same as a semiconductor material of the plurality of spacers.

14. A method for forming a polycrystalline semiconductor layer, comprising:
    forming a plurality of spacers over a dielectric layer, wherein the plurality of spacers comprises an amorphous semiconductor material;
    etching the dielectric layer using the plurality of spacers as an etch mask to form a recess in the dielectric layer;
    depositing an amorphous semiconductor layer over the plurality of spacers and the dielectric layer, the amorphous semiconductor layer filling the recess;
    irradiating the amorphous semiconductor layer and the plurality of spacers to completely melt horizontal portions of the amorphous semiconductor layer, while partially melt vertical portions of the amorphous semiconductor layer and the plurality of spacers, wherein the partially melting of the vertical portions of the amorphous semiconductor layer forms first unmelted portions adjacent to sidewalls of the recess, and the partially metaling of the plurality of spacers forms second unmelted portions outside of the recess;
    recrystallizing a melted portion of the amorphous semiconductor layer within the recess using the first unmelted portions as nucleation seeds to form a first polycrystalline semiconductor region; and
    recrystallizing melted portions of the amorphous semiconductor layer outside of the recess and melted portions of the plurality of spacers using the second unmelted portions as nucleation seeds to form second polycrystalline semiconductor regions over a top surface of the dielectric layer.

15. The method of claim 14, wherein the first polycrystalline semiconductor region completely fills the recess.

16. The method of claim 14, wherein the first polycrystalline semiconductor region comprises a pair of first crystal grains adjacent to lengthwise sidewalls of the recess and a pair of second crystal grains adjacent to widthwise sidewalls of the recess.

17. The method of claim 14, further comprising performing a planarization process to remove the second polycrystalline semiconductor regions from the top surface of the dielectric layer.

18. A method of fabricating a semiconductor device, comprising:
    forming a plurality of mandrel structures over a dielectric layer;
    depositing a spacer layer over the dielectric layer and the plurality of mandrel structures;
    etching the spacer layer to form a plurality of spacers between the plurality of mandrel structures;
    removing the plurality of mandrel structures, leaving the plurality of spacers protruding outward from the dielectric layer;

forming a plurality of recesses within the dielectric layer by removing portion of the dielectric layer not covered by the plurality of spacers;

depositing an amorphous semiconductor layer over the plurality of spacers and the dielectric layer, wherein the amorphous semiconductor layer fills the plurality of recesses;

recrystallizing the amorphous semiconductor layer to form a polycrystalline semiconductor layer; and forming a plurality of polycrystalline semiconductor regions within the plurality of recesses by removing portions of the polycrystalline semiconductor layer outside of the plurality of recesses.

19. The method of claim 18, further comprising patterning each polycrystalline semiconductor region of the plurality of polycrystalline semiconductor regions to form at least one semiconductor fin therein, wherein the at least one semiconductor fin is within a region that is free of grain boundaries.

20. The method of claim 19, further comprising forming a gate structure straddling a channel portion of the at least one semiconductor fin.

\* \* \* \* \*